United States Patent
Cockburn et al.

(10) Patent No.: US 12,262,559 B2
(45) Date of Patent: Mar. 25, 2025

(54) MONOLITHIC COMPLEMENTARY FIELD-EFFECT TRANSISTORS HAVING CARBON-DOPED RELEASE LAYERS

(71) Applicant: Applied Materials, Inc., Santa Clara, CA (US)

(72) Inventors: Andrew Anthony Cockburn, Brabant-Wallon (BE); Vanessa Pena, Leuven (BE); Daniel Philippe Cellier, Wallonia (BE); John Tolle, Gilbert, AZ (US); Thomas Kirschenheiter, Tempe, AZ (US); Wei Hong, Dublin, CA (US); Ellie Y. Yieh, San Jose, CA (US); Mehul Naik, San Jose, CA (US); Seshadri Ramaswami, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 391 days.

(21) Appl. No.: 17/715,331

(22) Filed: Apr. 7, 2022

(65) Prior Publication Data
US 2023/0326925 A1    Oct. 12, 2023

(51) Int. Cl.
*H10D 30/67* (2025.01)
*H01L 21/02* (2006.01)
(Continued)

(52) U.S. Cl.
CPC ..... *H10D 84/856* (2025.01); *H01L 21/02532* (2013.01); *H01L 21/02579* (2013.01);
(Continued)

(58) Field of Classification Search
CPC .......... H01L 29/0673; H01L 29/66787; H01L 29/78696; H01L 29/0669–068;
(Continued)

(56) References Cited

U.S. PATENT DOCUMENTS

| 10,236,292 B1 | 3/2019 | Frougier et al. |
| 10,685,887 B2 | 6/2020 | Smith et al. |

(Continued)

FOREIGN PATENT DOCUMENTS

KR    20220005402    1/2022

OTHER PUBLICATIONS

"Complementary FET (CFET)", Semiconductor Engineering, Retrieved from the internet: Mar. 7, 2022, <URLhttps://semiengineering.com/knowledge_centers/integrated-circuit/transistors/3d/cfet/>, 3 pages.
(Continued)

*Primary Examiner* — Laura M Menz
*Assistant Examiner* — Candice Chan
(74) *Attorney, Agent, or Firm* — Servilla Whitney LLC

(57) ABSTRACT

Embodiments of the disclosure advantageously provide semiconductor devices CFET in particular and methods of manufacturing such devices having a fully strained superlattice structure with channel layers that are substantially free of defects and release layers having a reduced selective removal rate. The CFET described herein comprise a vertically stacked superlattice structure on a substrate, the vertically stacked superlattice structure comprising: a first hGAA structure on the substrate; a sacrificial layer on a top surface of the first hGAA structure, the sacrificial layer comprising silicon germanium (SiGe) having a germanium content in a range of from greater than 0% to 50% on an atomic basis; and a second hGAA structure on a top surface of the sacrificial layer. Each of the first hGAA and the second (Continued)

hGAA comprise alternating layers of nanosheet channel layer that comprise silicon (Si) and nanosheet release layer that comprise doped silicon germanium (SiGe).

13 Claims, 3 Drawing Sheets

(51) Int. Cl.
  *H01L 21/306* (2006.01)
  *H10D 30/01* (2025.01)
  *H10D 62/10* (2025.01)
  *H10D 84/01* (2025.01)
  *H10D 84/03* (2025.01)
  *H10D 84/85* (2025.01)

(52) U.S. Cl.
  CPC .... *H01L 21/0259* (2013.01); *H01L 21/30604* (2013.01); *H10D 30/031* (2025.01); *H10D 30/6735* (2025.01); *H10D 30/6757* (2025.01); *H10D 62/118* (2025.01); *H10D 84/0167* (2025.01); *H10D 84/038* (2025.01)

(58) Field of Classification Search
  CPC ........... H01L 29/0665; H01L 29/66439; H01L 29/66469; H01L 29/7853–7856; H01L 29/78687; H01L 2924/13061; H01L 2029/7857–7858; Y10S 977/938; H10D 30/501–509; H10D 30/019–0198; H10D 30/43–435; H10D 30/014; H10D 62/119–123
  See application file for complete search history.

(56) References Cited

U.S. PATENT DOCUMENTS

| | | |
|---|---|---|
| 10,756,096 B2 | 8/2020 | Paul et al. |
| 10,833,180 B2 | 11/2020 | Song et al. |
| 11,133,310 B2 | 9/2021 | Fulford et al. |
| 2007/0111417 A1* | 5/2007 | Bryant ............ H01L 21/823807 257/288 |
| 2015/0295084 A1 | 10/2015 | Obradovic et al. |
| 2016/0334605 A1* | 11/2016 | Liu .......................... G02B 9/16 |
| 2016/0336405 A1 | 11/2016 | Sun et al. |
| 2019/0319095 A1* | 10/2019 | Zhang ................. H01L 29/1037 |
| 2021/0104523 A1 | 4/2021 | Fulford et al. |
| 2021/0210637 A1* | 7/2021 | Zhang ............... H01L 21/02532 |
| 2021/0407999 A1 | 12/2021 | Huang et al. |

OTHER PUBLICATIONS

Huang, C. Y., et al., "3-D Self-aligned Stacked NMOS-on-PMOS Nanoribbon Transistors for Continued Moore's Law Scaling", 2020 IEEE International Electron Devices Meeting (IEDM), 2020, pp. 20.6.1-20.6.4, doi: 10.1109/IEDM13553.2020.9372066.

Loubet, N. , et al., "A Novel Dry Selective Etch of SiGe for the Enablement of High Performance Logic Stacked Gate-All-Around NanoSheet Devices", 2019 IEEE International Electron Devices Meeting (IEDM), 2019, pp. 11.4.1-11.4.4, doi: 10.1109/IEDM19573.2019.8993615.

PCT International Search Report and Written Opinion in PCT/US2023/017245 dated Jul. 31, 2023, 8 pages.

* cited by examiner

MONOLITHIC COMPLEMENTARY FIELD-EFFECT TRANSISTORS HAVING CARBON-DOPED RELEASE LAYERS

TECHNICAL FIELD

Embodiments of the present disclosure pertain to the field of electronic device manufacturing, and in particular, to transistors. More particularly, embodiments of the disclosure are directed to complementary field-effect transistors (CFETs).

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a gate all around (GAA) structure. The GAA device structure includes several lattice matched channels suspended in a stacked configuration and connected by source/drain regions. The GAA structure provides good electrostatic control and can find broad adoption in complementary metal oxide semiconductor (CMOS) wafer manufacturing.

One example of gate-all-around (GAA) technology is complementary field effect transistor (CFET), where nFET and pFET nanowires/nanosheets are vertically stacked on top of each other. CFET transistors have increased on-chip device density and reduced area consumption when compared to GAA transistors. When stacking nFET and pFET in a monolithic manner, the n and p superlattice are deposited sequentially with a middle sacrificial layer that is selectively removed and replaced with a middle dielectric isolation during processing. The middle dielectric isolation layer serves to electrically isolate the lower-level GAA from the upper-level GAA.

Each n or p superlattice of a CFET includes alternating layers of channel layers and release layers. The release layers typically comprise silicon germanium (SiGe) with a low concentration of germanium (Ge). For etch contrast between the middle sacrificial layer verses the channel layers and the release layers, the middle sacrificial layer comprises SiGe with a high concentration of Ge. With such a high concentration of Ge in the middle sacrificial layer, however, the superlattice relaxes, and strain and mobility reduce, resulting in poor transistor performance due to reduced drive current.

Accordingly, there is a need for semiconductor devices, CFET in particular, and methods of manufacturing such devices having a fully strained superlattice structure with channel layers that are free or substantially free of defects and release layers having a reduced selective removal rate.

SUMMARY

One or more embodiments of the disclosure are directed to semiconductor devices. In one or more embodiments, a semiconductor device comprises a vertically stacked superlattice structure on a substrate, the vertically stacked superlattice structure comprising: a first horizontal gate-all-around (hGAA) structure on the substrate; a sacrificial layer on a top surface of the first hGAA structure, the sacrificial layer comprising silicon germanium (SiGe) having a germanium content in a range of from greater than 0% to 50% on an atomic basis; and a second horizontal gate-all-around (hGAA) structure on a top surface of the sacrificial layer. Each of the first hGAA and the second hGAA comprise alternating layers of nanosheet channel layer and nanosheet release layer. The nanosheet channel layer comprises silicon (Si) and the nanosheet release layer comprises doped silicon germanium (SiGe).

Additional embodiments of the disclosure are directed to methods of forming a semiconductor device. In one or more embodiments, a method of forming a semiconductor device comprises: forming a vertically stacked superlattice structure on a substrate by forming a first horizontal gate-all-around (hGAA) structure on a substrate; forming a sacrificial layer on a top surface of the first hGAA structure, the sacrificial layer comprising silicon germanium (SiGe) having a germanium content in a range of from greater than 0% to 50% on an atomic basis; and forming a second horizontal gate-all-around (hGAA) structure on a top surface of the sacrificial layer. Each of the first hGAA and the second hGAA comprise alternating layers of nanosheet channel layer and nanosheet release layer. The nanosheet channel layer comprises silicon (Si) and the nanosheet release layer comprises doped silicon germanium (SiGe).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
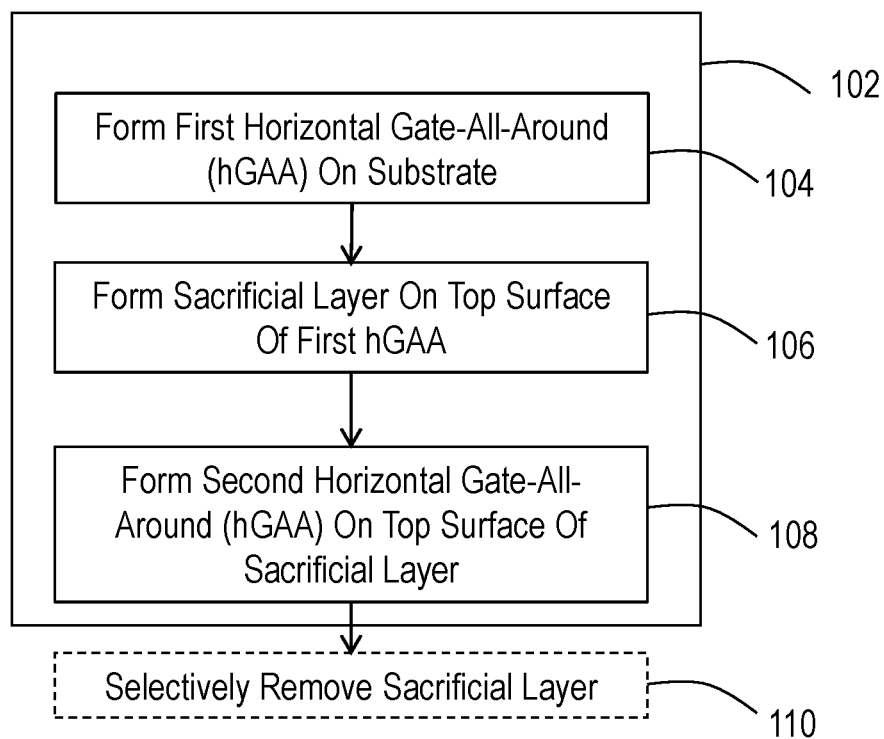
FIG. 1 illustrates a process flow diagram of a method of forming a semiconductor device according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Epitaxy" is a process by which a deposited film is forced into a high degree of crystallographic alignment with the substrate. Epitaxial growth is broadly defined as the condensation of gas precursors to form a film on a substrate. Liquid precursors may also be used. Vapor precursors may be obtained by chemical vapor deposition (CVD) and laser ablation. Several epitaxy techniques are now available, such as molecular beam epitaxy (MBE), epitaxial CVD, or atomic layer epitaxy (ALE).

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Field effect transistors are voltage-controlled devices where its current carrying ability is changed by applying an electric field. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity.

Conventionally, current entering the channel at the source (S) is designated IS and current entering the channel at the drain (D) is designated ID. Drain-to-source voltage is designated VDS. By applying voltage to gate (G), the current entering the channel at the drain (i.e., ID) can be controlled.

The metal-oxide-semiconductor field-effect transistor (MOSFET) is a type of field-effect transistor (FET) and is used in integrated circuits and high-speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET, is made up of a n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using NMOSs are said to have NMOS logic. There are three modes of operation in a NMOS called the cut-off, triode and saturation. Circuits with NMOS logic gates dissipate static power when the circuit is idling, since DC current flows through the logic gate when the output is low.

A pMOS FET is made up of p-type source and drain and a n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said have PMOS logic. PMOS technology is low cost and has a good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices. Furthermore, NMOS ICs would be smaller than PMOS ICs (that give the same functionality), since the NMOS can provide one-half of the impedance provided by a PMOS (which has the same geometry and operating conditions).

As used herein, the term "fin field-effect transistor (FinFET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nano-wires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "complementary field-effect transistor (CFET)" refers to a transistor that includes NMOS FET devices and PMOS FET devices stacked on each other. Each of the NMOS FET devices and the PMOS FET devices that form the CFET are GAA transistors or hGAA transistors.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm, or from 0.5 nm to 500 nm, or from 0.5 nm to 100 nm, or from 1 nm to 500 nm, or from 1 nm to 100 nm, or from 1 nm to 50 nm.

Without intending to be bound by theory, it is thought that relaxation in a vertically stacked superlattice structure comprising one or more hGAAs causes defects in nanosheet channel layers within the structure. Embodiments of the present disclosure advantageously provide semiconductor devices which comprise a fully strained vertically stacked superlattice structure having nanosheet channel layers that are free or substantially free of defects. In some embodiments, the presence of defects in the nanosheet channel layers are determined by a reciprocal space mapping (RSM) method. Without intending to be bound by theory, a RSM method is an x-ray diffraction method of collecting diffraction data of the vertically stacked superlattice structure in which the presence of defects may be observed. As used herein, the term "substantially free" means that the nanosheet channel layers are substantially free of defects as determined by a reciprocal space mapping (RSM) method.

In order to remove the sacrificial layer within a CFET superlattice without etching the nanosheet release layers, a three-color selectivity of >10:1 is required. Within typical patterned wafers, selectivity is very high for SiGe versus Si, meeting the >10:1 requirement. Selectivity, however, is much lower for SiGe with high germanium content (i.e., above 30% on an atomic basis) versus SiGe with low germanium content (i.e., 15-20% on an atomic basis), and does not satisfy the >10:1 requirement. Without intending to be bound by any particular theory of operation, it is believed that doping the SiGe release layers with a dopant, e.g., carbon (C), slows the etch rate of the SiGe, thus increasing the differential etch rate with the un-doped SiGe of the sacrificial layer. Thus, one or more embodiments of the present disclosure advantageously provide differentiation during etching of the SiGe layers (i.e., sacrificial layer and nanosheet release layers) relative to each other and relative to the channel layers.

In one or more embodiments, the release layers are advantageously doped with carbon (C), improving strain and mobility by reducing relaxation. At the same time, doping the release layers with carbon (C) reduces the etch rate of the release layers when compared to the etch rate of the sacrificial layer. In other words, doping the release layers with carbon (C) advantageously increases the etch rate of the middle sacrificial layer to facilitate easier removal without damage to the release layers or to the channel layer.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 depicts a process flow diagram of a method 100 of manufacturing a monolithic CFET device in accordance with one or more embodiments of the present disclosure. More specifically, FIG. 1 illustrates a process flow diagram of a method 100 of manufacturing an engineered substrate of an epitaxially grown superlattice composed of alternating layers of silicon (Si) and silicon germanium (SiGe) to be used for creating monolithic CFET devices. In one or more embodiments, the superlattice is strained and free of crystalline lattice defects and permits differential selective removal of two or more different compositions of SiGe. With reference to FIG. 1, the method 100 begins at operation 102 by forming a vertically stacked superlattice structure on a substrate. The vertically stacked superlattice structure on the substrate is formed by, forming a first horizontal gate-all-around (hGAA) structure on the substrate, at operation 104. At operation 106, a sacrificial layer is formed on a top surface of the first hGAA structure. At operation 108, a second horizontal gate-all-around (hGAA) structure on a top surface of the sacrificial layer. At operation 110, the method 100 optionally includes selectively removing the sacrificial layer so that a middle isolation layer may be formed during subsequent processing.

Figure 2:
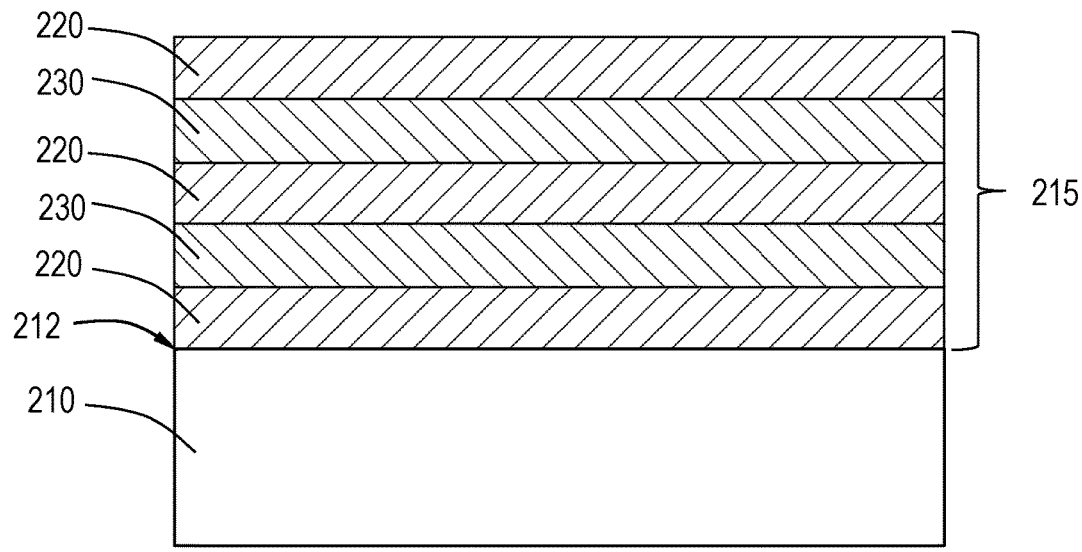
FIG. 2 illustrates a semiconductor structure according to one or more embodiments.
Figure 3:
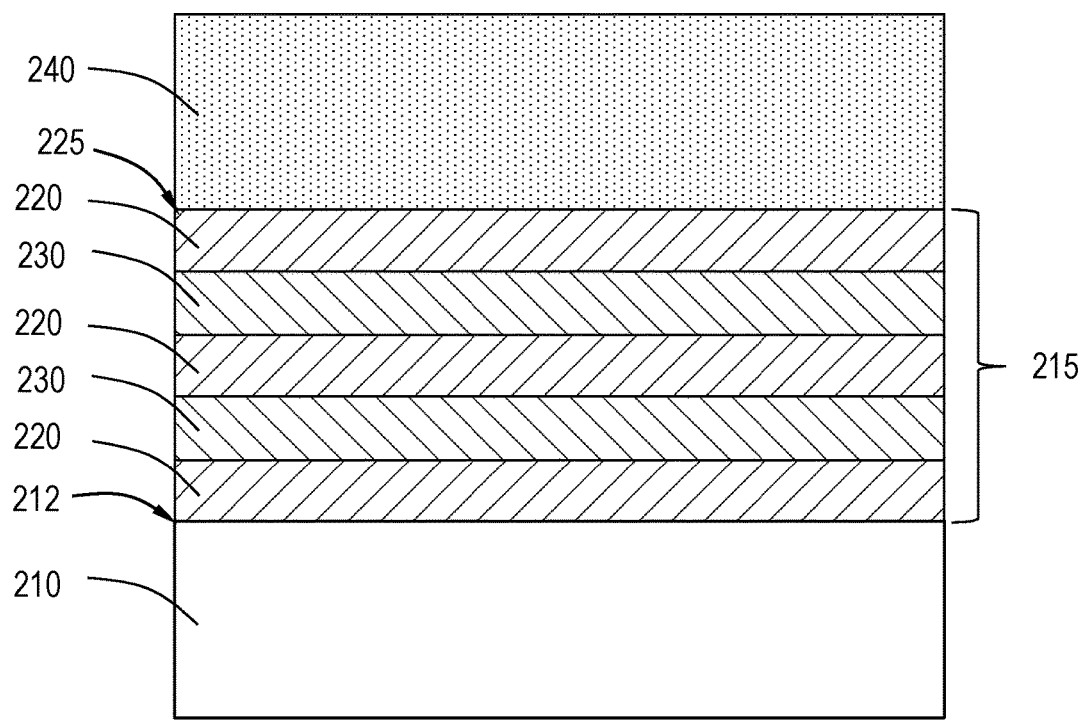
FIG. 3 illustrates a semiconductor structure according to one or more embodiments.
Figure 4:
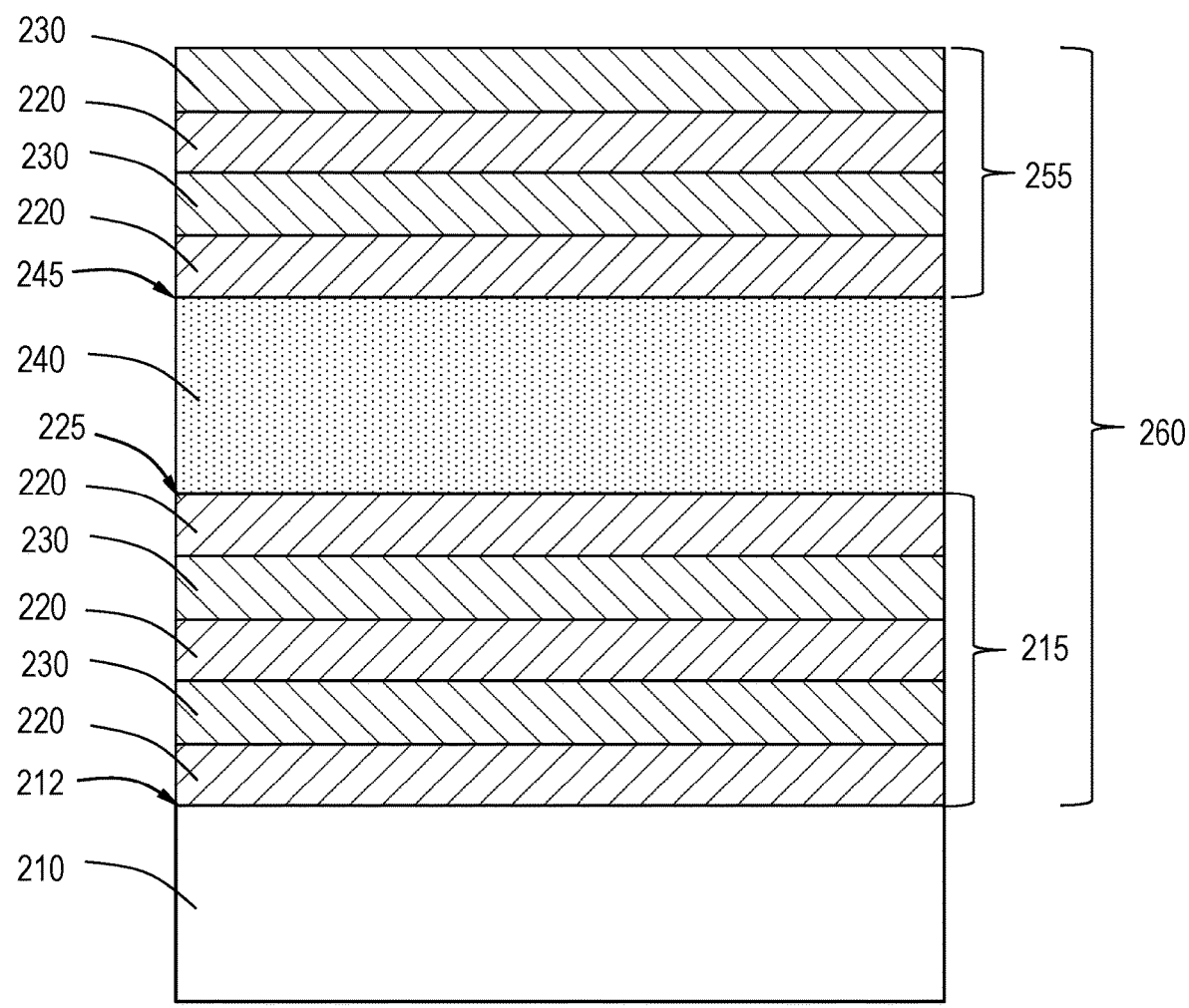
FIG. 4 illustrates a vertically stacked superlattice structure according to one or more embodiments.

FIGS. 2-4 illustrate cross-section views of a vertically stacked superlattice structure of a CFET device 200. The CFET devices 200 shown in FIGS. 2-4 may be manufactured by the method 100 illustrated in FIG. 1.

In one or more embodiments, the CFET device 200 includes a substrate 210 having a top surface 212. The substrate 210 can be any suitable substrate material known to the skilled artisan. In one or more embodiments, the substrate 210 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the substrate 210 comprises one or more of silicon (Si), germanium (Ge), gallium (Ga), arsenic (As), indium (In), phosphorus (P), or selenium (Se). Although a few examples of materials from which the substrate 210 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the substrate 210 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In one or more embodiments, the vertically stacked superlattice structure 260 comprises one or more horizontal gate-all-around (hGAA) structures on the substrate 210. In some embodiments, the vertically stacked superlattice structure 260 comprises a first or lower horizontal gate-all-around (hGAA) structure 215 on the substrate 210. In some embodiments, at operation 104 of method 100, the vertically stacked superlattice structure 260 comprises a first or lower horizontal gate-all-around (hGAA) structure 215 on the top surface 212 of the substrate 210. In some embodiments, the vertically stacked superlattice structure 260 comprises a second or upper horizontal gate-all-around (hGAA) structure 255. Without intending to be bound by any particular theory of operation, the first or lower hGAA 215 and the second or upper hGAA 255 may independently comprise the same structure having the same layers. In the illustrated embodiments of FIGS. 3 and 4, the vertically stacked superlattice structure 260 comprises the first hGAA structure 215 on the top surface 212 of the substrate 210, a sacrificial layer 240 on a top surface 225 of the first hGAA structure 215, formed at operation 106 of method 100, and the second hGAA structure 255 on a top surface 245 of the sacrificial layer 240, formed at operation 108 of method 100.

Referring again to FIGS. 2-4, in some embodiments, each of the first hGAA 215 and the second hGAA 255 comprise alternating layers of nanosheet channel layer 230 and nanosheet release layer 220. In some embodiments, the plurality of nanosheet release layers 220 and the plurality of nanosheet channel layers 230 can comprise any number of lattice matched material pairs suitable for forming the vertically stacked superlattice structure 260. In some embodiments, each of the first hGAA 215 and the second hGAA 255 have in a range of from 1 to 5 pairs of alternating layers of nanosheet channel layer 230 and nanosheet release layer 220.

The nanosheet release layers 220 may have any suitable thickness. In one or more embodiments, each nanosheet release layer 220 has a thickness in a range of from 5 nm to 15 nm. The nanosheet channel layers 230 may have any suitable thickness. In one or more embodiments, each nanosheet channel layer 230 has a thickness in a range of from 5 nm to 15 nm.

In some embodiments, each of the nanosheet channel layers 230 independently comprises silicon (Si). In some embodiments, each of the nanosheet release layers 220 independently comprises silicon germanium (SiGe) doped with a dopant. In one or more embodiments, the nanosheet release layers 220 comprises silicon germanium (SiGe) having a germanium content in a range of from greater than 0% to 30% on an atomic basic. In specific embodiments, the nanosheet release layers 220 comprise silicon germanium (SiGe) having a germanium content in a range of from about 10% to 25% on an atomic basis.

The silicon germanium (SiGe) of the nanosheet release layer 220 may be doped with any suitable dopant that comprises an element that has an atomic weight that is less than the atomic weight of silicon (Si). In some embodiments, the silicon germanium (SiGe) of the nanosheet release layer 220 is doped with a dopant comprising one or more of carbon (C) and boron (B). In one or more specific embodiments, the silicon germanium (SiGe) of the nanosheet release layer 220 is doped with carbon (C).

In one or more embodiments, the dopant of the nanosheet release layer 220 may have any suitable concentration. In some embodiments, the dopant has a concentration in a range of from greater than 0% to less than or equal to 2% dopant on an atomic basis. In some embodiments, the dopant has a concentration of less than or equal to 2% dopant on an atomic basis, including in a range of from 0.1% to 1.99% dopant on an atomic basis. In some embodiments, the dopant has a concentration in a range of from 0.1% to 1.99%, including in a range of from 0.1% to 1.95%, in a range of from 0.1% to 1.9%, in a range of from 0.2% to 1.8%, in a range of from 0.3% to 1.7%, in a range of from 0.4% to 1.6%, in a range of from 0.5% to 1.5%, in a range of from 0.6% to 1.4%, in a range of from 0.7% to 1.3%, in a range of from 0.8% to 1.2%, and in a range of from 0.9% to 1.1% dopant on an atomic basis.

In specific embodiments, the dopant is carbon (C), and the carbon concentration in a range of from greater than 0% to less than or equal to 2% carbon (C) on an atomic basis. In some embodiments, the nanosheet release layer 220 is doped with carbon (C), and the concentration of carbon (C) in the nanosheet release layer 220 in a range of from greater than 0% to less than or equal to 2% carbon on an atomic basis. In some embodiments, the concentration of carbon in the nanosheet release layer 220 is less than or equal to 2% carbon on an atomic basis, including in a range of from 0.1% to 1.99% carbon on an atomic basis. In some embodiments, the concentration of carbon in the nanosheet release layer 220 is in a range of from 0.1% to 1.99%, including in a range of from 0.1% to 1.95%, in a range of from 0.1% to 1.9%, in a range of from 0.2% to 1.8%, in a range of from 0.3% to 1.7%, in a range of from 0.4% to 1.6%, in a range of from 0.5% to 1.5%, in a range of from 0.6% to 1.4%, in a range of from 0.7% to 1.3%, in a range of from 0.8% to 1.2%, and in a range of from 0.9% to 1.1% carbon on an atomic basis.

In other embodiments, the nanosheet release layer 220 dopant is boron (B) and the dopant has a concentration is in a range of from greater than 0% to less than or equal to 2% boron (B) on an atomic basis.

In one or more embodiments, the nanosheet release layer 220 may include a dopant comprising one or more of carbon (C) and boron (B), and the total combined dopant concentration can be in a range of from greater than 0% to less than or equal to 2%. Thus, in some embodiments, the nanosheet release layer 220 is doped with both carbon (C) and boron (B).

In one or more embodiments, it has been advantageously found that doping the silicon germanium (SiGe) of the nanosheet release layer 220 permits control of the strain of the vertically stacked superlattice structure 260. Embodiments of the disclosure advantageously provide a fully strained vertically stacked superlattice structure 260 where each of the nanosheet release layers 220 independently comprises doped silicon germanium (SiGe). More specifically, embodiments of the disclosure advantageously provide a fully strained vertically stacked superlattice structure 260 where each of the nanosheet release layers 220 independently comprises silicon germanium (SiGe) doped with carbon (C).

In one or more embodiments, it has been surprisingly discovered that doping the silicon germanium (SiGe) of the nanosheet release layer 220 with carbon (C) reduces strain in the vertically stacked superlattice structure 260 and permits a higher growth temperature, and, thereby results in an increased growth rate of forming the vertically stacked superlattice structure 260. As used herein, "increased growth rate" refers to reduced amount of time to form the layers of the vertically stacked superlattice structure 260. Stated differently, doping the silicon germanium (SiGe) of nanosheet release layer 220 with carbon (C) provides an increase in growth rate by a factor of at least 2, or a factor of at least 3, at a temperature of about 600° C. when compared to a growth rate at a temperature of about 560° C. Embodiments of the disclosure advantageously provide a full strained vertically stacked superlattice structure 260 where each of the nanosheet release layers 220 independently comprises silicon germanium (SiGe) doped with carbon (C).

In one or more embodiments, a sacrificial layer 240 is formed between the first or lower hGAA and the second or upper hGAA. In one or more embodiments, the middle sacrificial layer 240 is selectively removed and replaced with a middle dielectric isolation during later processing. The middle dielectric isolation layer serves to electrically isolate the source/drain regions of the lower-level GAA 215 from the source/drain regions of the upper-level GAA 255. In one or more embodiments, the sacrificial layer 240 comprises silicon germanium (SiGe) having a germanium content in a range of from greater than 15% to 50% on an atomic basic. In specific embodiments, the nanosheet release layers 220 comprise silicon germanium (SiGe) having a germanium content in a range of from about 10% to 30% on an atomic basis and the sacrificial layer 240 comprises silicon germanium (SiGe) having a germanium content in a range of from 20% to 40% on an atomic basic. In specific embodiments, the sacrificial layer 240 comprises silicon germanium (SiGe) having a germanium content in a range of from about 20% to 50% on an atomic basis, including 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, and 50%.

In one or more embodiments, the sacrificial layer 240 may have any suitable thickness. In some embodiments, the sacrificial layer 240 has a thickness in a range of from 15 nm to 90 nm, including a range of from 15 nm to 80, a range of from 20 nm to 75 nm, a range of from 15 nm to 60 nm, a range of from 15 nm to 50 nm, a range of from 15 nm to 75 nm, and a range of from 20 nm to 50 nm. In some embodiments, increasing the thickness of the sacrificial layer 240 to greater than 40 nm increases the etch selectivity between the sacrificial layer 240 and the nanosheet release layer 220.

As recognized by one of skill in the art, during subsequent processing, the sacrificial layer 240 may be removed and replaced with a middle isolation layer. Thus, at operation 110, the method 100 optionally includes selectively removing the sacrificial layer 240. Selectively removing the sacrificial layer 240 may be performed by any suitable means known to the skilled artisan. In some embodiments, selectively removing the sacrificial layer 240 comprises an etch process that removes the sacrificial layer 240 and does not remove the nanosheet release layers 220. In some embodiments, the etch process comprises one or more of a wet etch process or a dry etch process. In some embodiments, the etch process is a directional etch.

Each of the nanosheet release layers 220, the nanosheet channel layers 230 and the sacrificial layer 240 within the vertically stacked superlattice structure 260 has its own selective removal rate. Without intending to be bound by theory, it is believed that a high germanium content (e.g., greater than 30% germanium on an atomic basis) of the sacrificial layer 240 increases the selective removal rate within a vertically stacked superlattice structure, and doping the SiGe of the nanosheet release layers 220 with carbon reduces the etch rate of the nanosheet release layers, resulting in >10:1 selectivity between the sacrificial layer 240 and the nanosheet release layers 220. In one or more embodiments, increasing the thickness of the sacrificial layer 240 to a thickness of greater than 40 nm results in an increased selectivity of greater than 15:1 between the sacrificial layer 240 and the nanosheet release layers 220.

In one or more embodiments, it has been advantageously found that doping the silicon germanium (SiGe) of the nanosheet release layer 220 with a dopant (e.g., carbon (C)) having a dopant concentration in a range of from greater than 0% to less than or equal to 2% dopant on an atomic basis, permits differentiation of the nanosheet release layers 220, the nanosheet channel layers 230, and the sacrificial layer 240 within the vertically stacked superlattice structure 260. Stated differently, doping the silicon germanium (SiGe) of the nanosheet release layer 220 with carbon (C) advantageously reduces the selective removal rate of each nanosheet release layer within the vertically stacked superlattice structure 260. Embodiments of the present disclosure advantageously provide methods of selectively removing a sacrificial layer while reducing the selective removal rate thereof, without damaging the nanosheet release layers and the nanosheet channel layers within one or more of the first hGAA 215 or second hGAA 255.

In one or more embodiments, it has been advantageously found that the nanosheet release layer 220 doped with carbon (C) has an etch rate that is reduced compared to a nanosheet release layer that is not doped with carbon (C). In some embodiments, the etch rate is reduced by a factor of at least 2.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor device, the method comprising:
   forming a vertically stacked superlattice structure on a substrate by
   forming a first horizontal gate-all-around (hGAA) structure on a substrate;
   forming a sacrificial layer on a top surface of the first hGAA structure, the sacrificial layer comprising silicon germanium (SiGe) having a germanium content in a range of from greater than 0% to 50% on an atomic basis; and
   forming a second horizontal gate-all-around (hGAA) structure on a top surface of the sacrificial layer,
   wherein each of the first hGAA structure and the second hGAA structure comprise alternating layers of nanosheet channel layer and nanosheet release layer, each nanosheet channel layer independently comprising silicon (Si) and each nanosheet release layer independently comprising silicon germanium (SiGe) doped with a dopant, and wherein each nanosheet release layer has an etch rate that is reduced compared to the sacrificial layer.

2. The method of claim 1, wherein the sacrificial layer comprises silicon germanium (SiGe) having a germanium content in a range of from 20% to 50% on an atomic basis.

3. The method of claim 2, wherein each nanosheet release layer comprises silicon germanium (SiGe) having a germanium content in a range of from 10% to 30% on an atomic basis.

4. The method of claim 3, wherein the sacrificial layer comprises silicon germanium (SiGe) having a germanium content in a range of from greater than 30% to 50% on an atomic basis and wherein each nanosheet release layer comprises silicon germanium (SiGe) having a concentration in a range of from greater than 15% to 20% on an atomic basis doped with carbon having a carbon concentration in a range of from greater than 0% to less than or equal to 2% on an atomic basis.

5. The method of claim 1, wherein the sacrificial layer has a thickness in a range of from 15 nm to 90 nm.

6. The method of claim 1, wherein each of the first hGAA structure and the second hGAA structure have in a range of from 1 to 5 pairs of alternating layers of nanosheet channel layer and nanosheet release layer.

7. The method of claim 1, wherein the dopant comprises one or more of carbon (C), and boron (B).

8. The method of claim 7, wherein the silicon germanium (SiGe) of each nanosheet release layer is doped with carbon (C).

9. The method of claim 8, wherein doping the silicon germanium (SiGe) of each nanosheet release layer with carbon (C) reduces strain in the vertically stacked superlattice structure and permits a higher growth temperature and an increased growth rate.

10. The method of claim 7, wherein the dopant has a concentration in a range of from greater than 0% to less than or equal to 2% dopant on an atomic basis.

11. The method of claim 1, wherein the etch rate is reduced by a factor of at least 2.

12. The method of claim 1, wherein the vertically stacked superlattice structure is fully strained and each nanosheet channel layer is substantially free of defects.

13. The method of claim 1, further comprising selectively removing the sacrificial layer.

* * * * *